(12) United States Patent
Nie et al.

(10) Patent No.: US 11,056,513 B2
(45) Date of Patent: Jul. 6, 2021

(54) THIN FILM TRANSISTOR ARRAY SUBSTRATE, DISPLAY PANEL AND DISPLAY DEVICE

(71) Applicant: Wuhan China Star Optoelectronics Technology Co., Ltd., Hubei (CN)

(72) Inventors: Xiaohui Nie, Guangdong (CN); Jiawei Zhang, Guangdong (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 149 days.

(21) Appl. No.: 16/162,363

(22) Filed: Oct. 16, 2018

(65) Prior Publication Data

US 2019/0371826 A1 Dec. 5, 2019

Related U.S. Application Data

(63) Continuation of application No. PCT/CN2018/101643, filed on Aug. 22, 2018.

(30) Foreign Application Priority Data

May 30, 2018 (CN) .......................... 201810539241.1

(51) Int. Cl.
*H01L 27/12* (2006.01)
*H01L 27/02* (2006.01)
*G02F 1/1362* (2006.01)

(52) U.S. Cl.
CPC ...... *H01L 27/1244* (2013.01); *H01L 27/0266* (2013.01); *H01L 27/1218* (2013.01); *G02F 1/136204* (2013.01)

(58) Field of Classification Search
CPC ............ H01L 27/1244; H01L 27/0266; H01L 27/1218; H01L 23/60
See application file for complete search history.

(56) References Cited

U.S. PATENT DOCUMENTS 6,088,073 A * 7/2000 Hioki ................ G02F 1/136204
349/40
2015/0062511 A1 3/2015 Shin et al.

FOREIGN PATENT DOCUMENTS

| CN | 1540396 A | 10/2004 |
|---|---|---|
| CN | 103928444 A | 7/2014 |
| CN | 205069639 U | 3/2016 |
| CN | 205609530 U | 9/2016 |

(Continued)

OTHER PUBLICATIONS

1st Office Action of counterpart Chinese Patent Application No. 201810539241.1 dated Mar. 20, 2020.

*Primary Examiner* — Sue A Purvis
*Assistant Examiner* — Scott Stowe

(57) ABSTRACT

The present disclosure discloses a thin film transistor array substrate, a display panel and a display device. The array substrate includes a substrate and an electrostatic discharge circuit layer, and the electrostatic discharge circuit layer is disposed in the non-display area at a side of the substrate and includes a conductive circuit disposed around the display area and electrostatic discharge devices electrically connected with the conductive circuit. The electrostatic discharge device includes a plurality of electrostatic discharge units disposed at intervals, one end of each of the electrostatic discharge units is connected with an edge of the substrate and the other end thereof is connected with the conductive circuit.

18 Claims, 7 Drawing Sheets

(56) References Cited

FOREIGN PATENT DOCUMENTS

| CN | 106094374 A | 11/2016 |
|----|-------------|---------|
| CN | 106445221 A | 2/2017 |
| CN | 106773414 A | 5/2017 |
| CN | 107170760 A | 9/2017 |

* cited by examiner

THIN FILM TRANSISTOR ARRAY SUBSTRATE, DISPLAY PANEL AND DISPLAY DEVICE

CROSS-REFERENCE TO RELATED APPLICATIONS

The present application is a continuation-application of International (PCT) Patent Application No. PCT/CN2018/101643 filed on Aug. 22, 2018, which claims foreign priority of Chinese Patent Application No. 2018/10539241.1, filed on May 30, 2018 in the State Intellectual Property Office of China, the contents of all of which are hereby incorporated by reference.

FIELD OF THE INVENTION

The present disclosure generally relates to the technical field of displaying, and more particularly, relates to a thin film transistor (TFT) array substrate, a display panel and a display device.

BACKGROUND OF THE INVENTION

Low temperature poly-Si thin film transistors (LTPS-TFTs) are predominantly characterized by a high mobility of carriers and a small size of devices or the like, and thus become the key technology for developing display panels of low power consumption and a high integration degree. The manufacturing of LTPS-TFT array substrates requires multiple processes such as film forming, photolithography and cleaning or the like and involves many process machines. During the production, the rubbing contact between an array substrate and a process machine is very likely to cause accumulation of static electricity, which results in electrostatic discharge (ESD) damage to an LTPS-TFT film layer and finally results in the failure of the devices. In order to prevent the ESD damage to the devices during the manufacturing process of the LTPS-TFT array substrate, a commonly used solution is to manufacture a metal guard ring at the periphery of the display area of a screen. Heavily-doped poly-Si is used at two ends of the guard ring as electrostatic discharge devices to guide the discharge of the static electricity outside the display area, thereby protecting semiconductor devices in the display area.

However, in the related art, the film layer of the electrostatic discharge device has relatively large thickness and has a different coefficient of thermal expansion from other layers, so stress is accumulated between the film layer of the electrostatic discharge device and the other layers. Meanwhile, there are relatively large differences between the film layer structure of the electrostatic discharge device and other regions, which results in the formation of steps. When the array substrate and a color filter (CF) substrate are cut after being assembled, the heavily-doped poly-Si electrostatic discharge devices bear relatively large stress due to the existence of the steps, which causes the breakage of the film layer.

SUMMARY OF THE INVENTION

The present disclosure provides a thin film transistor (TFT) array substrate, a display panel and a display device so as to solve the problem in the related art that cutting the LTPS array substrate is likely to cause the breakage of the film layer.

To solve the aforesaid technical problem, one technical solution adopted by the present disclosure is to provide a thin film transistor array substrate, including:

a substrate, comprising a display area and a non-display area surrounding the display area;

an electrostatic discharge circuit layer, disposed in the non-display area at a side of the substrate and comprising a conductive circuit disposed around the display area and a electrostatic discharge device electrically connected with the conductive circuit;

wherein the electrostatic discharge device includes a plurality of electrostatic discharge units disposed at intervals, one end of each of the electrostatic discharge units is connected with an edge of the substrate and the other end thereof is connected with the conductive circuit.

To solve the aforesaid technical problem, another technical solution adopted by the present disclosure is to provide a display panel, including a thin film transistor (TFT) array substrate and a color filter (CF) substrate stacked together, wherein the TFT array substrate includes:

a substrate, comprising a display area and a non-display area surrounding the display area;

an electrostatic discharge circuit layer, disposed in the non-display area at a side of the substrate and comprising a conductive circuit disposed around the display area and a electrostatic discharge device electrically connected with the conductive circuit;

wherein the electrostatic discharge device comprises a plurality of electrostatic discharge units disposed at intervals, one end of each of the electrostatic discharge units is connected with an edge of the substrate and the other end thereof is connected with the conductive circuit.

To solve the aforesaid technical problem, yet another technical solution adopted by the present disclosure is to provide a display device, including a display panel, the display panel including a thin film transistor (TFT) array substrate and a color filter (CF) substrate stacked together, wherein the TFT array substrate includes:

a substrate, comprising a display area and a non-display area surrounding the display area;

an electrostatic discharge circuit layer, disposed in the non-display area at a side of the substrate and comprising a conductive circuit disposed around the display area and a electrostatic discharge device electrically connected with the conductive circuit;

wherein the electrostatic discharge device comprises a plurality of electrostatic discharge units disposed at intervals, one end of each of the electrostatic discharge units is connected with an edge of the substrate and the other end thereof is connected with the conductive circuit.

Benefits of the present disclosure are as follows: by dividing the electrostatic discharge device into a plurality of electrostatic discharge units disposed at intervals, the internal stress of the electrostatic discharge device can be reduced, and meanwhile the intervals between the electrostatic discharge units may provide sufficient elastic deformation spaces during the cutting, thereby preventing the breakage of the film layer of the display panel during the cutting and improving the cutting yield of the display panel.

DETAILED DESCRIPTION OF THE INVENTION

To make technical problems to be solved by the present disclosure, technical solutions adopted by the present disclosure and technical effects achieved by the present disclosure clearer, the technical solutions of embodiments of the present disclosure will be further described in detail hereinafter with reference to attached drawings.

In the description of the present disclosure, "a plurality of" means at least two, for example, two, three, etc., unless expressly limited. All directional instructions (such as upper, lower, left, right, front, back . . . ) in the present disclosure are only used to explain the relative position relationship and motion between components in a particular attitude (as shown in the attached drawings), and when the particular attitude changes, the directional instructions will also be changed accordingly. In addition, the terms "include", "have" and any variation thereof are intended to encompass the items listed thereafter and equivalents thereof as well as additional items. For example, a process, a method, a system, a product or a device that includes a series of steps or components is not limited to these steps or components already listed, instead, it may optionally include many inherent steps or components not listed here.

The term "embodiment" recited in the present disclosure means that, specific features, structures or properties described with reference to the embodiment can be included in at least one embodiment of the present disclosure. The terms "embodiment" used in different positions of the specification does not always refer to the same embodiment, and does not indicate that this embodiment is the embodiment exclusive and independent from other embodiments, or the alternative embodiment of other embodiments. One skilled in the art may explicitly or implicitly understands that, the embodiment described in the present disclosure can be combined with other embodiments.

Figure 1:
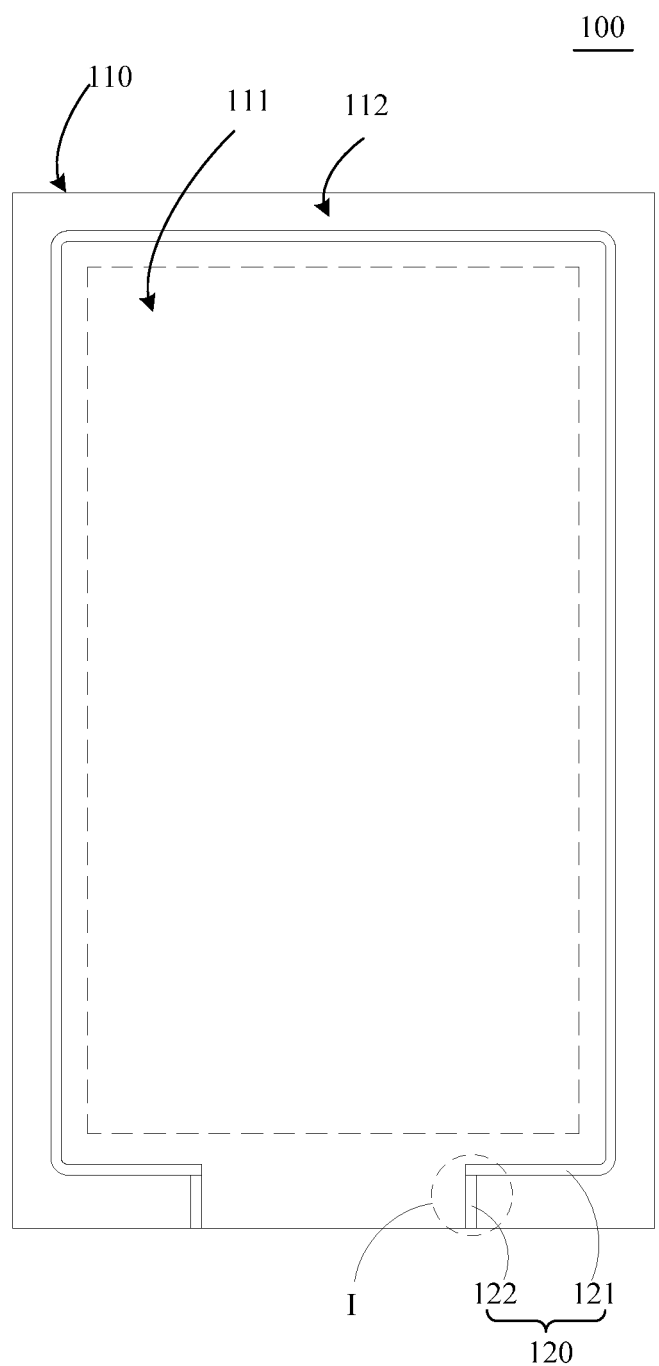
FIG. 1 is a schematic structural view of an embodiment of a thin film transistor (TFT) array substrate according to the present disclosure.
Figure 2:
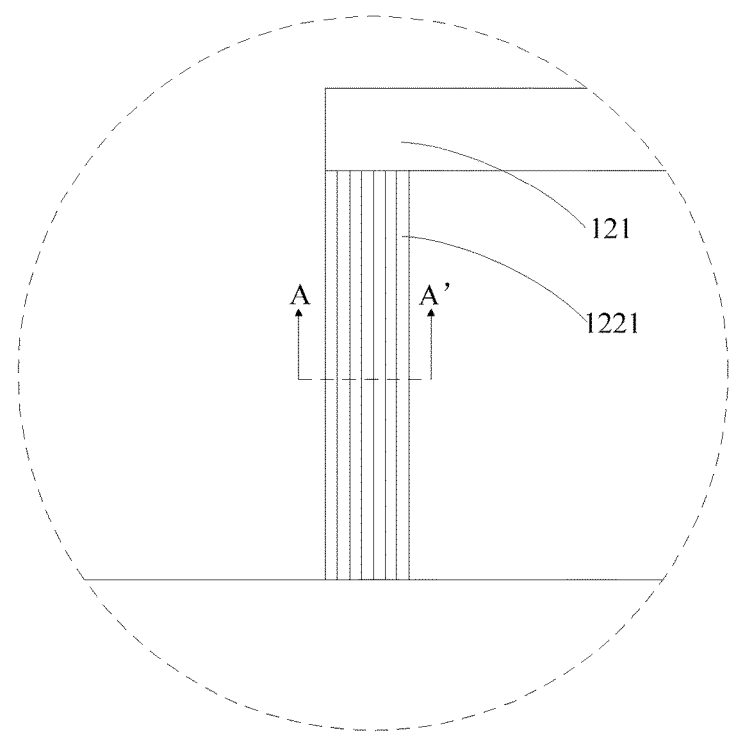
FIG. 2 is a partially-enlarged schematic structural view of the TFT array substrate of FIG. 1 in a region I.
Figure 3:
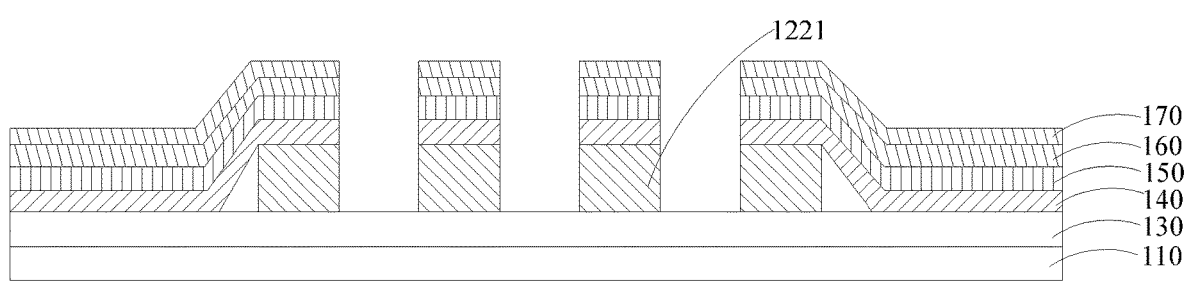
FIG. 3 is a sectional view of the TFT array substrate of FIG. 2 taken at a cross section A-A'.

Referring to FIG. 1 to FIG. 3, FIG. 1 is a schematic structural view of an embodiment of a thin film transistor (TFT) array substrate according to the present disclosure, FIG. 2 is a partially-enlarged schematic structural view of the TFT array substrate of FIG. 1 in a region I, and FIG. 3 is a sectional view of the TFT array substrate of FIG. 2 taken at a cross section A-A'. A thin film transistor (TFT) array substrate 100 may include a substrate 110 and an electrostatic discharge circuit layer 120 disposed at a side of the substrate 110. The substrate 110 may include a display area 111 and a non-display area 112, the display area 111 may be disposed at a middle region of the substrate 110, and the non-display area 112 may be disposed at a edge region of the substrate 110 to surround the display area 111. The electrostatic discharge circuit layer 120 may be disposed at the non-display area 112. The electrostatic discharge circuit layer 120 may include a conductive circuit 121 and a electrostatic discharge device 122, wherein the conductive circuit 121 surrounds the display area 111, and two ends of the conductive circuit 121 are respectively connected with one electrostatic discharge device 122. The electrostatic discharge device 122 may include a plurality of electrostatic discharge units 1221 disposed at intervals, and one end of each of the electrostatic discharge units 1221 may be connected to the edge of the substrate 110, and the other end thereof extends towards a inner side of the substrate 110. Therefore, by dividing the electrostatic discharge device 122 into a plurality of electrostatic discharge units 1221 disposed at intervals, the internal stress of the electrostatic discharge device may be reduced, and meanwhile the intervals between the electrostatic discharge units 1221 may provide sufficient elastic deformation spaces during the cutting, thereby preventing the breakage of the film layer of the display panel during the cutting and improving the cutting yield of the display panel.

Further referring to FIG. 2 and FIG. 3, in this embodiment, the plurality of electrostatic discharge units 1221 may be arranged in the shape of comb teeth so that the electrostatic discharge device 122 has a compact structure, thereby reducing the space required for disposing the electrostatic discharge device 122 and improving the structural compactness of the TFT array substrate 100.

In other embodiments, the plurality of electrostatic discharge units 1221 may also not be arranged in the shape of comb teeth.

Figure 4:
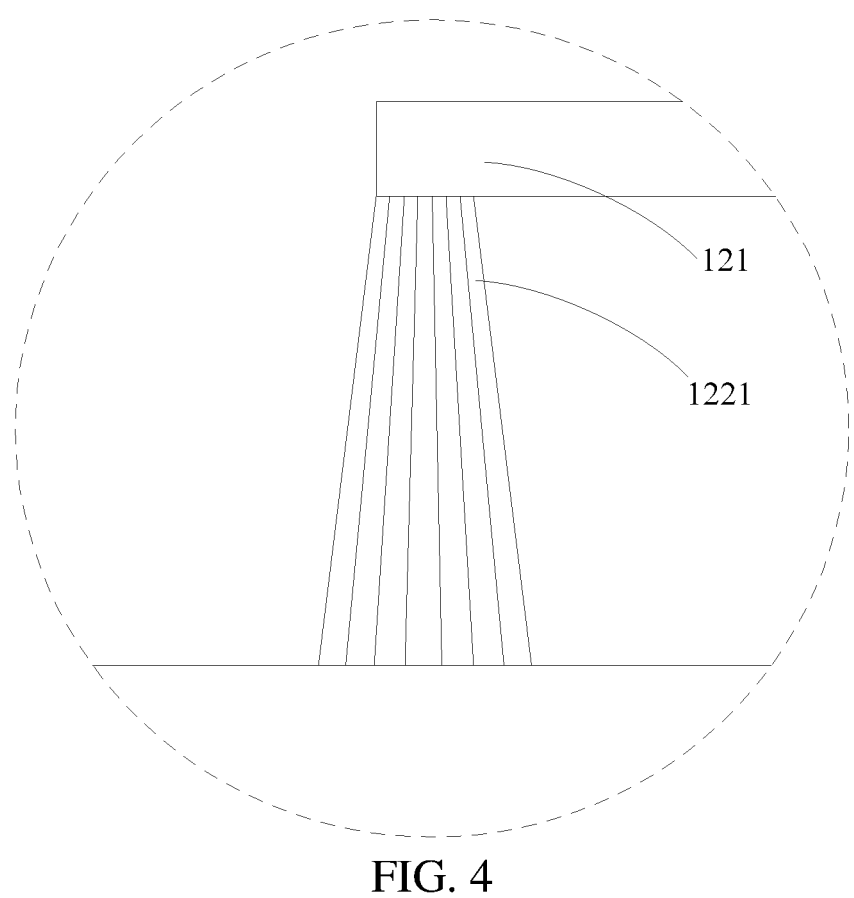
FIG. 4 is a partially-enlarged schematic structural view of another embodiment of the TFT array substrate of FIG. 1 in the region I.

Referring to FIG. 4, FIG. 4 is a partially-enlarged schematic structural view of another embodiment of the TFT array substrate of FIG. 1 in the region I. At least one electrostatic discharge unit 1221 may be configured to have width gradually decreasing along a direction from the edge of the substrate 100 to the inner side of the substrate 100.

Figure 5:
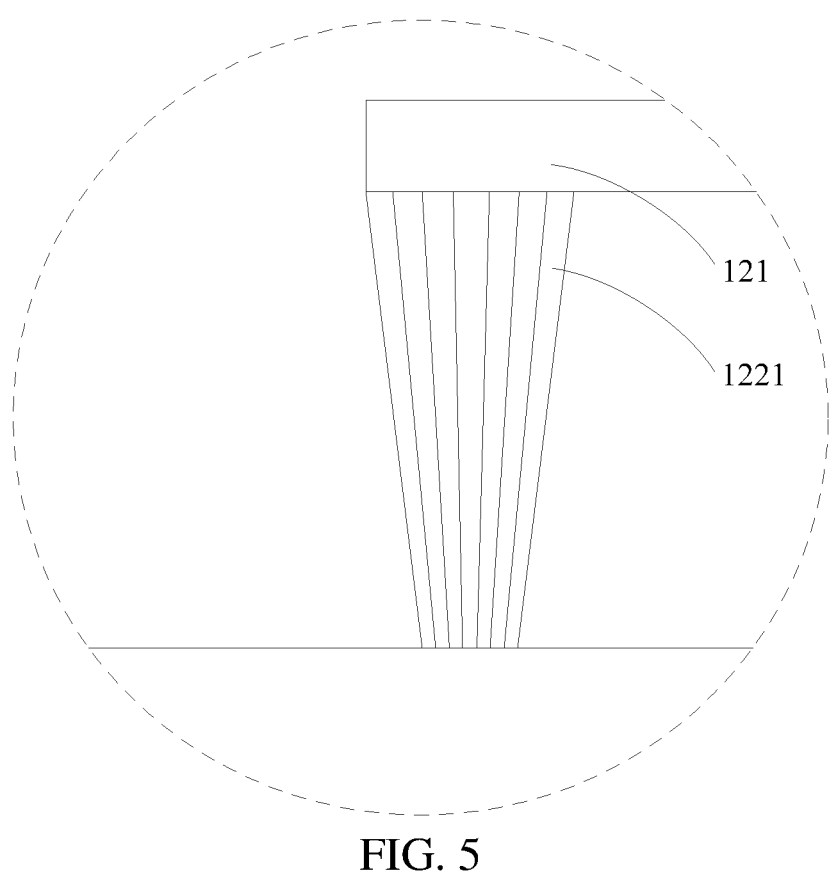
FIG. 5 is a partially-enlarged schematic structural view of another embodiment of the TFT array substrate of FIG. 1 in the region I.

Referring to FIG. 5, FIG. 5 is a partially-enlarged schematic structural view of another embodiment of the TFT array substrate of FIG. 1 in the region I. At least one electrostatic discharge unit 1221 may be configured to have width gradually increasing along the direction from the edge of the substrate 100 to the inner side of the substrate 100.

Figure 6:
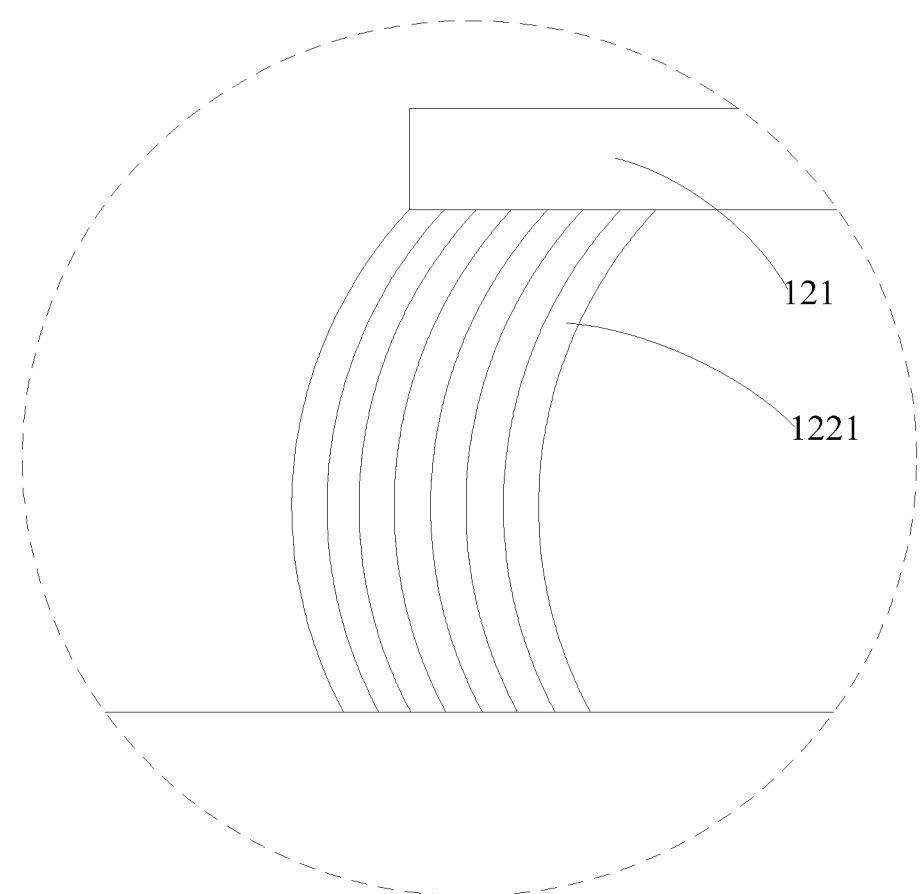
FIG. 6 is a partially-enlarged schematic structural view of another embodiment of the TFT array substrate of FIG. 1 in the region I.

Referring to FIG. 6, FIG. 6 is a partially-enlarged schematic structural view of another embodiment of the TFT array substrate of FIG. 1 in the region I. The electrostatic discharge units 1221 may extend in the shape of curved lines. The electrostatic discharge units 1221 may extend in the shape of arc lines or S-shaped lines, and no limitation is made to the shape of the curved lines in the embodiments of the present disclosure. By disposing the electrostatic discharge units 1221 in the shape of curved lines, the electrostatic discharge units 1221 may bypass other elements to prevent circuit interference.

In this embodiment, one end of each of the electrostatic discharge units 1221 may be connected to the edge of the substrate 110, and the other end thereof extends towards the inner side of the substrate 110 to be electrically connected with the conductive circuit 121.

In this embodiment, the substrate 110 may be a glass substrate, and a buffering layer 130 may be further provided between the substrate 110 and the electrostatic discharge circuit layer 120. The buffering layer 130 may be disposed at a surface of a side of the substrate 110, and the electrostatic discharge circuit layer 120 may be disposed at a surface of a side of the buffering layer 130 that is opposite to the substrate 110. The material of the buffering layer 130 may be any one or more of SiNx or SiOx, and the buffering layer 130 may be used to prevent metal ions in the substrate 110 from diffusing in the direction going deep into the electrostatic discharge circuit layer 120, thereby ensuring that the TFT array substrate 100 can operate normally.

In this embodiment, the electrostatic discharge device 122 may be heavily-doped poly-Si, and the electrostatic discharge circuit layer 122 constituted by the electrostatic discharge device 122 and the conductive circuit 121 may discharge the static electricity generated in the TFT array substrate 100, thereby improving the antistatic capability of the TFT array substrate 100.

In this embodiment, a gate insulating layer 140, an interlayer insulating layer 150, a spacer layer 160 and a passivation protection layer 170 may be sequentially stacked on a side of the electrostatic discharge circuit layer 120 that is opposite to the buffering layer 130. The gate insulating layer 140 may be configured to form an accommodating space with the buffering layer 130 to surround the electrostatic discharge circuit layer 120. The gate insulating layer 140 may isolate and protect the electrostatic discharge circuit layer 120. The interlayer insulating layer 150 may be disposed at a surface of a side of the gate insulating layer 140 that is opposite to the electrostatic discharge circuit layer 120, the spacer layer 160 may be disposed at a surface of a side of the interlayer insulating layer 150 that is opposite to the gate insulating layer 140, and the passivation protection layer 170 may be disposed at a surface of a side of the spacer layer 160 that is opposite to the interlayer insulating layer 150.

On the cross section A-A', each of the electrostatic discharge units 1221 has the gate insulating layer 140, the interlayer insulating layer 150, the spacer layer 160 and the passivation protection layer 170 stacked sequentially thereon, and the widths of the gate insulating layer 140, the interlayer insulating layer 150, the spacer layer 160 and the passivation protection layer 170 on each of the electrostatic discharge units 1221 may be equal to the width of the electrostatic discharge unit 1221, i.e., the gate insulating layers 140, the interlayer insulating layers 150, the spacer layers 160 and the passivation protection layers 170 on the plurality of electrostatic discharge units 1221 may be also arranged in the shape of comb teeth.

The gate insulating layer 140 may be formed of SiOx, the interlayer insulating layer 150 may be formed of SiNx and/or SiOx. The spacer layer 160 may be formed of SiNx, and the passivation protection layer 170 may be formed of SiNx.

Since the spacer layer 160 and the passivation protection layer 170 may be made of the same material, it can be appreciated to be that the spacer layer 160 and the passivation protection layer 170 may be a same film layer formed of the same material in the non-display area 112.

The interlayer insulating layer 150 separating the conductive circuit 121 into a first circuit layer and a second circuit layer, wherein the first circuit layer may be formed of metal molybdenum, and the second circuit layer may be formed of metal titanium-aluminum alloy. The interlayer insulating layer 150 and the first circuit layer and the second circuit layer are stacked sequentially, wherein the first circuit layer may be disposed at a side of the insulating layer 150 that is close to the substrate 110, and the second circuit layer may be disposed at a side of the insulating layer 150 that is opposite to the substrate 110. The main function of the passivation protection layer 170 is to isolate and protect the thin film transistor within the display area 111.

In this embodiment, the buffering layer 130, the electrostatic discharge circuit layer 120, the gate insulating layer 140, the interlayer insulating layer 150, the spacer layer 160 and the passivation protection layer 170 may be formed sequentially on the substrate 110 by the photolithography technique.

Figure 7:
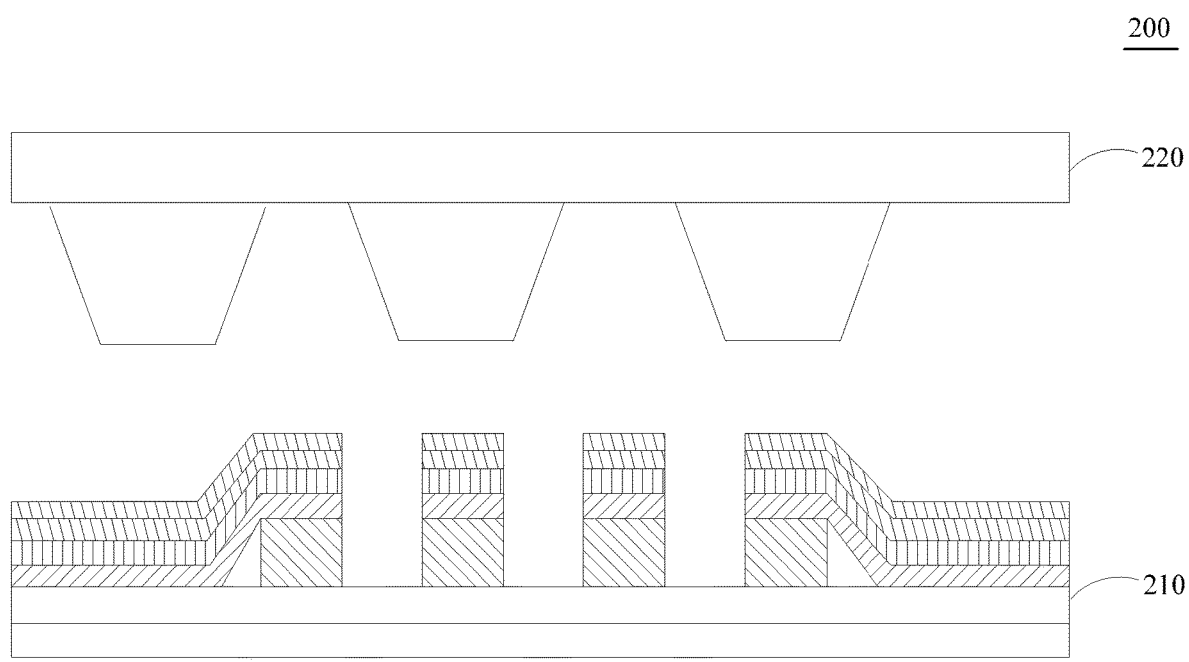
FIG. 7 is a schematic structural view of an embodiment of a display panel provided by the present disclosure.

As compared to the related art, the present disclosure further provides a display panel. Referring to FIG. 7, FIG. 7 is a schematic structural view of an embodiment of a display panel provided by the present disclosure. The display panel 200 may include a color filter (CF) substrate 220 and a thin film transistor (TFT) array substrate 210, and the TFT array substrate 210 may include the TFT array substrate according to any of the embodiments described above and thus will not be further described herein.

Figure 8:
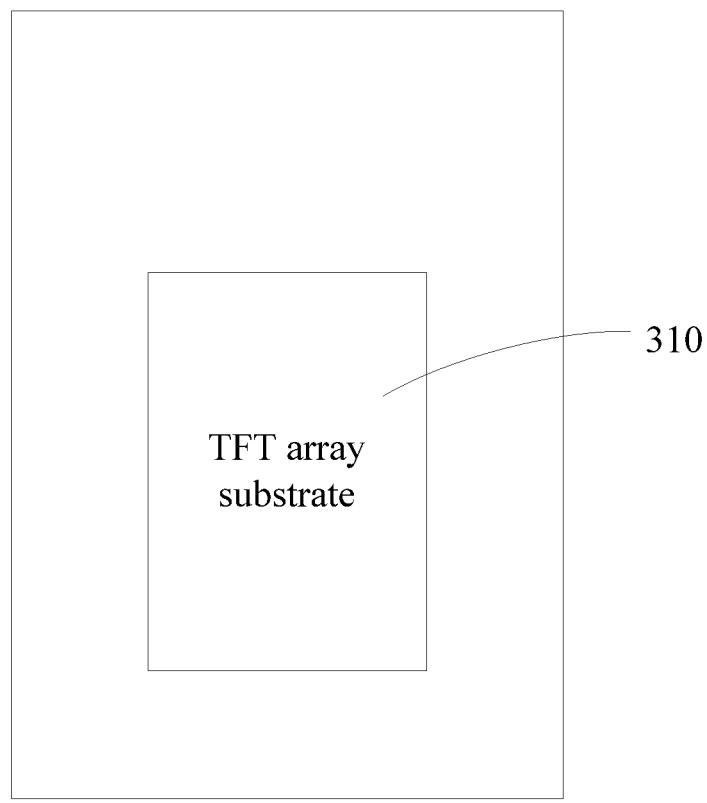
FIG. 8 is a schematic structural view of an embodiment of a display device provided by the present disclosure.

Further speaking, as compared to the related art, the present disclosure further provides a display device. Referring to FIG. 8, FIG. 8 is a schematic structural view of an embodiment of a display device provided by the present disclosure. The display device 300 may include a thin film transistor (TFT) array substrate 310, and the TFT array substrate 310 may include the TFT array substrate according to any of the embodiments described above and thus will not be further described herein. The display device 300 may be a device having a display screen such as a mobile phone, a tablet computer, a computer and a television or the like.

According to the above descriptions, the present disclosure provides a thin film transistor array substrate, a display panel and a display device, and by disposing the electrostatic discharge device of the TFT array substrate in the shape of comb teeth, the internal stress of the electrostatic discharge device can be reduced, thereby preventing the breakage of the film layer of the display panel during the cutting and improving the cutting yield of the display panel.

The foregoing is merely embodiments of the present disclosure, and is not intended to limit the scope of the present disclosure. Any equivalent structure or flow transformation made based on the specification and the accompanying drawings of the present disclosure, or any direct or indirect applications of the disclosure on other related fields, shall all be covered within the protection of the present disclosure.

What is claimed is:

1. A thin film transistor (TFT) array substrate, comprising:
   a substrate, comprising a display area and a non-display area surrounding the display area;
   an electrostatic discharge circuit layer, disposed in the non-display area at a side of the substrate and comprising a conductive circuit disposed around the display area and an electrostatic discharge device electrically connected with the conductive circuit;
   wherein the electrostatic discharge device comprises a plurality of electrostatic discharge units disposed at intervals, one end of each of the electrostatic discharge units is connected with an edge of the substrate and the other end thereof is connected with the conductive circuit; a cross section of the plurality of electrostatic discharge units is in the shape of comb teeth;
   a buffering layer is further provided between the substrate and the electrostatic discharge circuit layer.

2. The TFT array substrate of claim 1, wherein at least one of the plurality of electrostatic discharge units is configured to have width gradually decreasing along a direction from the edge of the substrate to an inner side of the substrate.

3. The TFT array substrate of claim 1, wherein at least one of the plurality of electrostatic discharge units is configured to have width gradually increasing along a direction from the edge of the substrate to an inner side of the substrate.

4. The TFT array substrate of claim 1, wherein the plurality of electrostatic discharge units extend in the shape of curved lines.

5. The TFT array substrate of claim 1, wherein the material of the electrostatic discharge units comprises Poly-Si.

6. The TFT array substrate of claim 1, wherein a gate insulating layer, an interlayer insulating layer, a spacer layer and a passivation protection layer are sequentially stacked on a side of the electrostatic discharge units that is opposite to the substrate.

7. A display panel, comprising a thin film transistor (TFT) array substrate and a color filter (CF) substrate stacked together, the TFT array substrate comprising:
   a substrate, comprising a display area and a non-display area surrounding the display area;
   an electrostatic discharge circuit layer, disposed in the non-display area at a side of the substrate and comprising a conductive circuit disposed around the display area and an electrostatic discharge device electrically connected with the conductive circuit;
   wherein the electrostatic discharge device comprises a plurality of electrostatic discharge units disposed at intervals, one end of each of the electrostatic discharge units is connected with an edge of the substrate and the other end thereof is connected with the conductive circuit.

8. The display panel of claim 7, wherein a cross section of the electrostatic discharge units is in the shape of comb teeth.

9. The display panel of claim 7, wherein at least one of the plurality of electrostatic discharge units is configured to have width gradually decreasing along a direction from the edge of the substrate to an inner side of the substrate.

10. The display panel of claim 7, wherein a buffering layer is further provided between the substrate and the electrostatic discharge circuit layer.

11. The display panel of claim 7, wherein the material of the electrostatic discharge units comprises Poly-Si;
   a gate insulating layer, an interlayer insulating layer, a spacer layer and a passivation protection layer are sequentially stacked on a side of the electrostatic discharge units that is opposite to the substrate.

12. A display device, comprising a display panel, the display panel comprising a thin film transistor (TFT) array substrate and a color filter (CF) substrate stacked together, the TFT array substrate comprising:
   a substrate, comprising a display area and a non-display area surrounding the display area;
   an electrostatic discharge circuit layer, disposed in the non-display area at a side of the substrate and comprising a conductive circuit disposed around the display area and an electrostatic discharge device electrically connected with the conductive circuit;
   wherein the electrostatic discharge device comprises a plurality of electrostatic discharge units disposed at intervals, one end of each of the electrostatic discharge units is connected with an edge of the substrate and the other end thereof is connected with the conductive circuit.

13. The display device of claim 12, wherein a cross section of the electrostatic discharge units is in the shape of comb teeth.

14. The display device of claim 12, wherein at least one of the plurality of electrostatic discharge units is configured to have width gradually decreasing along a direction from the edge of the substrate to an inner side of the substrate.

15. The display device of claim 12, wherein at least one of the plurality of electrostatic discharge units is configured to have width gradually increasing along a direction from the edge of the substrate to an inner side of the substrate.

16. The display device of claim 12, wherein a buffering layer is further provided between the substrate and the electrostatic discharge circuit layer.

17. The display device of claim 12, wherein the material of the electrostatic discharge units comprises Poly-Si.

18. The display device of claim 12, wherein a gate insulating layer, an interlayer insulating layer, a spacer layer and a passivation protection layer are sequentially stacked on a side of the electrostatic discharge units that is opposite to the substrate.

* * * * *